United States Patent
Abbasi et al.

(10) Patent No.: US 6,411,142 B1
(45) Date of Patent: Jun. 25, 2002

(54) COMMON BIAS AND DIFFERENTIAL STRUCTURE BASED DLL WITH FAST LOCKUP CIRCUIT AND CURRENT RANGE CALIBRATION FOR PROCESS VARIATION

(75) Inventors: Saeed Abbasi, Wynnewood; Martin E. Perrigo, Newtown, both of PA (US)

(73) Assignee: ATI International, SRL (BB)

( * ) Notice: Subject to any disclaimer, the term of this patent is extended or adjusted under 35 U.S.C. 154(b) by 0 days.

(21) Appl. No.: 09/730,890

(22) Filed: Dec. 6, 2000

(51) Int. Cl.$^7$ .................................. H03L 7/06
(52) U.S. Cl. ........................ 327/156; 327/145
(58) Field of Search .................. 327/145, 146, 327/147, 148, 153, 155, 156, 157, 158, 161, 162, 163, 277, 270, 284; 331/25, 1 R, DIG. 2

(56) References Cited

U.S. PATENT DOCUMENTS

| | | | | |
|---|---|---|---|---|
| 5,629,651 A | * | 5/1997 | Mizuno | 327/158 |
| 5,699,020 A | * | 12/1997 | Jefferson | 331/1 R |
| 5,994,934 A | * | 11/1999 | Yoshimura | 327/158 |
| 6,043,717 A | * | 3/2000 | Kurd | 331/25 |
| 6,127,865 A | * | 10/2000 | Jefferson | 327/149 |
| 6,127,866 A | * | 10/2000 | Chu et al. | 327/158 |
| 6,184,753 B1 | * | 2/2001 | Ishimi et al. | 327/270 |
| 6,232,806 B1 | * | 5/2001 | Woeste et al. | 327/149 |

OTHER PUBLICATIONS

Johns et al., "Analog Integrated Circuit Design", 1997, Canada, Chapter 16, pp. 675–679.
Maneatis, John G., "Low–Jitter Process–Independent DLL and PLL Based on Self–Biased Techniques", IEEE Journal of Solid State Circuits, vol. 31, No. 11, pp. 1723–1732, Nov. 1996.
Baker et al., "CMOS Circuit Design, Layout, and Simulation", 1998, Chapter 19, pp. 417–423.

* cited by examiner

*Primary Examiner*—Toan Tran
*Assistant Examiner*—Linh Nguyen
(74) *Attorney, Agent, or Firm*—Volpe and Koenig, P.C.

(57) ABSTRACT

A delay lock loop (DLL) circuit for generating a precisely delayed output signal relative to an input signal. The DLL circuit includes a phase detector for detecting a phase difference between the input signal and the DLL output signal, a lock circuit for detecting when the difference between the input signal and the output signal is zero, and a delay element control circuit for increasing and decreasing the phase of the output signal. This circuit design reduces processing delay, improves jitter performance, and extends the DLL operating frequency range.

13 Claims, 5 Drawing Sheets

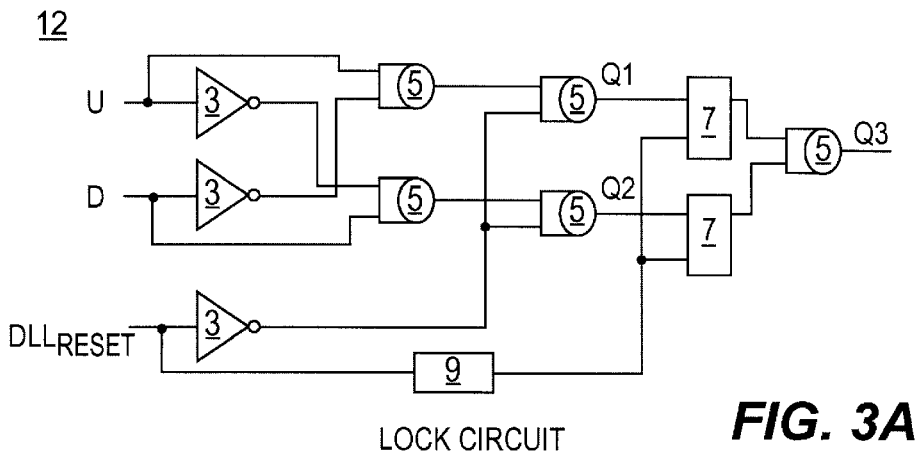
FIG. 3A LOCK CIRCUIT
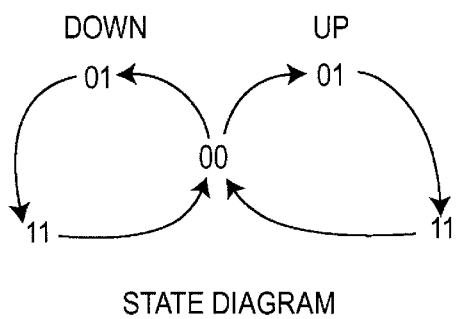
STATE DIAGRAM
FIG. 3B
| UP | DOWN | Q1 | Q2 | Q3 |
|----|------|----|----|----|
| 0 | 0 | 0 | 0 | 0 |
| 0 | 1 | 0 | 1 | 0 |
| 1 | 1 | 0 | 1 | 0 |
| 0 | 0 | 0 | 1 | 0 |
| 0 | 1 | 0 | 1 | 0 |
| 1 | 1 | 0 | 1 | 0 |
| - | - | - | - | 0 |
| 0 | 0 | 0 | 1 | 0 |
| 1 | 0 | 1 | 1 | 1 |
| 1 | 1 | 1 | 1 | 1 |
| 1 | 1 | 1 | 1 | 1 |
| - | - | - | - | 1 |
| 0 | 0 | 1 | 1 | 1 |
| 0 | 1 | 1 | 1 | 1 |
| 1 | 1 | 1 | 1 | 1 |
| - | - | - | - | 1 |
| 0 | 0 | 1 | 1 | 1 |
| 1 | 0 | 1 | 1 | 1 |
| 1 | 1 | 1 | 1 | 1 |
EXAMPLE OF LOCK PROCESS
FIG. 3C

DLL FLOW DIAGRAM

COMMON BIAS AND DIFFERENTIAL STRUCTURE BASED DLL WITH FAST LOCKUP CIRCUIT AND CURRENT RANGE CALIBRATION FOR PROCESS VARIATION

BACKGROUND

The present invention relates generally to delay locked loop (DLL) circuits. More particularly, this invention relates to a DLL circuit which is based on a variable length plurality of differential delay elements, an advanced common biasing technique which tolerates process variations and calibrates current range for operational variances and lock detection for faster processing.

Delay-locked loops are often used in the I/O interfaces of digital integrated circuits in order to hide clock distribution delays and to improve overall system timing. In recent years, the demand has risen for devices capable of high-speed processing. As a result, the demand for DLL circuits that quickly compensate for electronic noise and capacitive delays has also risen.

One type of design used by those skilled in the art to minimize the noise present in the circuit at the required speed is a self-bias signal technique. Referring to FIG. 1, this prior art DLL circuit is a self-biasing configuration which is composed of a phase comparator, charge pump, loop filter, bias generator and a plurality of delay cells. In this configuration, devices dependent on a precisely delayed clock signal must delay processing for a standardized time period to insure that the received signal is exact. This processing delay is caused by the fact that most DLL circuits are designed to tolerate the worst case conditions. The DLL circuit performance during this worst case condition is the processing delay time set for most devices using the output of this circuit.

This prior art design uses a constant charge pump current which gives rise to a constant damping factor and a constant loop bandwidth. A constant bandwidth can constrain the achievement of a wide operating frequency range and low input tracking jitter. If the frequency is disturbed, the phase error that results from each cycle of the disturbance will accumulate for many cycles until the loop can compensate for the phase error. The error will be accumulated for a number of cycles, which is proportional to the operating frequency divided by the loop bandwidth. Thus the loop bandwidth would have to be positioned as close as possible to the reference frequency bandwidth to minimize the total phase error. The result is that the frequency bandwidth must be conservatively set for stability at the lowest operating frequency with worst case process variations rather than set for optimized jitter performance. The self-biased DLL also exhibits much faster locking times only when locking from similar or higher operating frequencies. However, if the self-biased DLL is started at a very low operating frequency, it will exhibit very slow locking times.

Accordingly, there is a need for a DLL circuit which provides a fast lock-up circuit, has better jitter performance, tolerates process variations, reduces power consumption, reduces processing delay time and extends the DLL operating frequency range.

SUMMARY

The present invention is a DLL circuit which is based on a common bias technique, comprising a plurality of differential delay elements, a fast lock-up circuit and a self-calibration current range setting circuit. This design provides improved speed in detecting and locking to an incoming signal. The invention also extends the DLL operating range, improves DLL jitter performance, provides greater immunity to environmental noise, and improves the power supply rejection ratio (PSRR).

BRIEF DESCRIPTION OF THE DRAWINGS

FIG. 3A is a logic gate diagram of the lock circuit in accordance with the preferred embodiment of the present invention;

FIG. 3B is a state diagram of the lock circuit inputs in accordance with the preferred embodiment of the present invention;

FIG. 3C is a logic table for the lock circuit in accordance with the preferred embodiment of the present invention;

DESCRIPTION OF THE PREFERRED EMBODIMENTS

Figure 1:
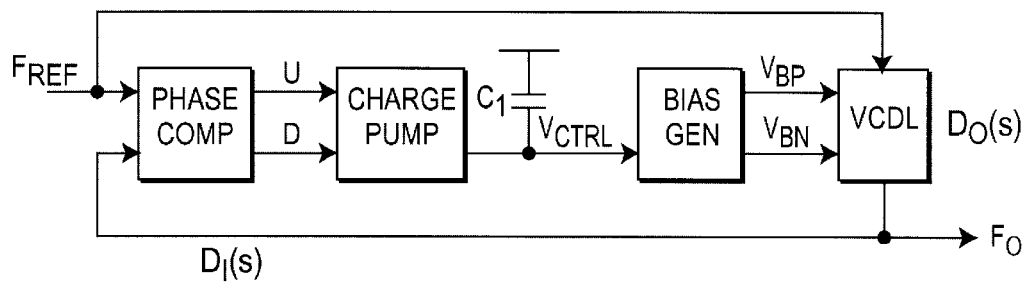
FIG. 1 is a block diagram of a typical DLL circuit.

The first embodiment of the present invention will be described with reference to the drawing figures wherein like numerals represent like elements throughout.

Figure 2:
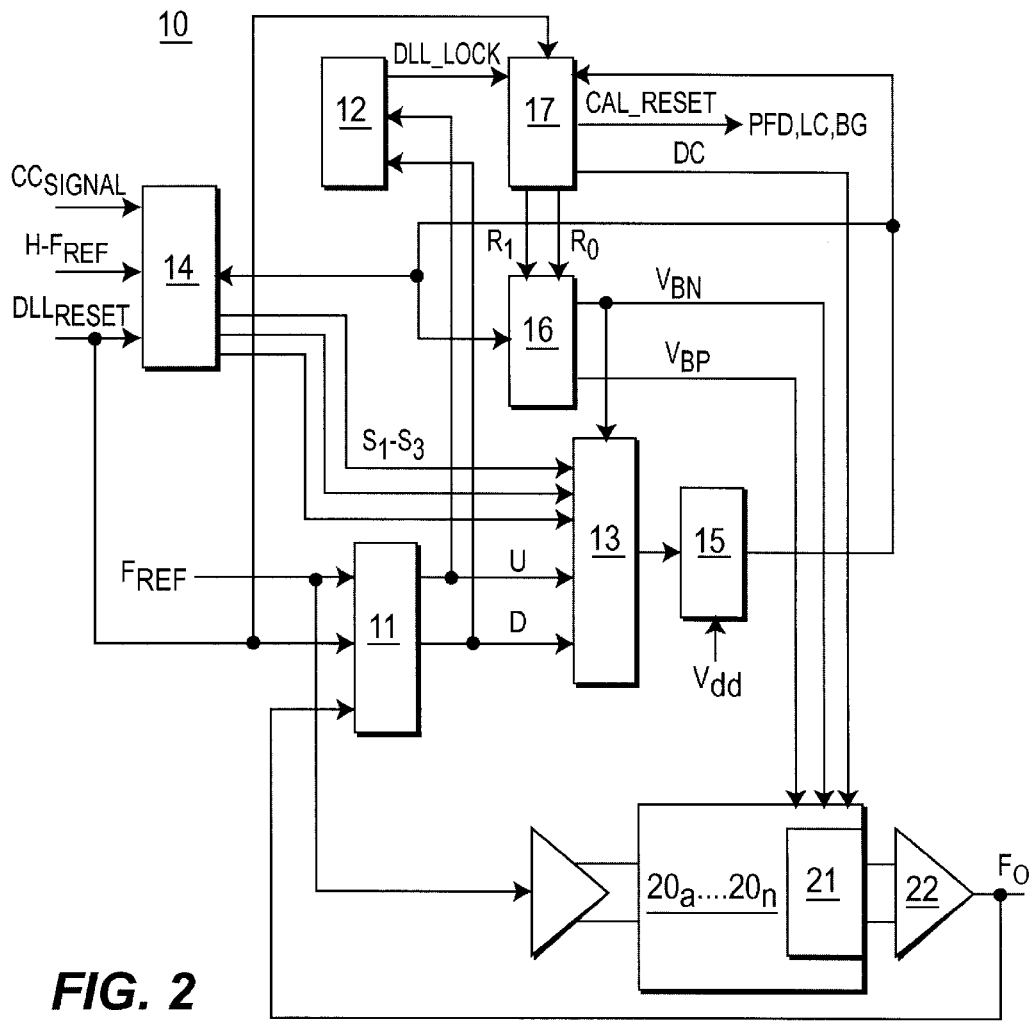
FIG. 2 is a block diagram of the circuit in accordance with the preferred embodiment of the present invention.

Referring to FIG. 2, a DLL circuit 10 made in accordance with the present invention is shown. The DLL circuit 10 includes a phase frequency detector (PFD) 11, a lock circuit 12, a charge pump 13, a charge pump control circuit 14, a loop filter 15 including a capacitor C1 (not shown), a common bias generator 16, a current range control circuit 17, a delay cell switching circuit 21 and a plurality of delay cells $20_a \ldots 20_n$. The PFD 11 receives a reference signal $F_{ref}$ from an outside source, a reset signal $DLL_{reset}$ and the DLL output signal $F_o$. Coupled to the PFD 11 are the lock circuit 12 and the charge pump 13. As those skilled in the art should know, the PFD 11 determines the phase difference between the reference signal $F_{ref}$ and the DLL 10 output signal $F_o$. If the PFD 11 detects a phase difference between the two input signals $F_{ref}$, $F_o$, the phase error signals U, D are sent to the lock circuit 12 and the charge pump 13. The duration (pulse width) of these output signals U, D depends on the amount of phase error that is detected by the PFD 11.

The lock circuit 12, shown in FIG. 3A, is controlled by the phase error signals U, D output from the PFD 11. Coupled to the PFD 11 and the current range control circuit 17, the lock circuit 12 monitors the crossing of the phase of the DLL output signal $F_o$ and the phase of the reference signal $F_{ref}$, as will be disclosed hereinafter. The lock circuit 12 comprises a plurality of invertors 3, a plurality of AND gates 5, two S-R flip flops 7 and a delay 9. When the lock circuit 12 detects the crossing of the phase of the two signals $F_o$, $F_{ref}$, the lock circuit 12 provides an output $Q_3$ to the current range control circuit 17 to remain at the present bias current level. The output $Q_3$ of the lock circuit 12, as the DLL circuit 10 attempts to match the phase of the output signal $F_o$ with the phase of the reference signal $F_{ref}$, is illustrated in the logic table of FIG. 3C.

Referring to FIGS. 3B and 3C, as the DLL circuit 10 comes out of reset, the error signals U, D are in the neutral state 0, 0. Since the output frequency $F_o$ is out of phase with the reference frequency $F_{ref}$, the error signals U, D go to a state 0, 1 indicating that the loop filter 15 capacitor C1 must be charged. On the subsequent rising edge of the reference frequency $F_{ref}$, the error signals U, D go to a state 1, 1. This state causes the PFD 11 to reset and return the error signals U, D to their neutral state 0, 0. This process continues until the phase of the output frequency $F_o$ passes the phase of the reference frequency $F_{ref}$ which is indicated by the error signals U, D going to a state 1, 0. This condition will signal the lock circuit 12 to output a logical one (1) to the current range control circuit 17, indicating that the current range control circuit 17 should maintain the bias current at the present level which will be described in greater detail hereinafter.

The lock circuit 12 operates to quickly detect the matching of the phases of reference signal $F_{ref}$ and output signal $F_o$. Once this condition is detected, the lock circuit 12 provides the output signal $Q_3$ to the current range control circuit 17 to remain at the present bias current level, the optimal bias current $I_{bias}$ (shown in FIG. 4A) to be output to the plurality of delay cells $20_a \ldots 20_n$. This lock circuit 12 provides fast signal lock detection so that devices using the DLL 10 output signal $F_o$ do not have to delay processing for a longer period of time than necessary, resulting in faster device processing time.

Referring back to FIG. 2, the error signals U, D from the PFD 11 are also forwarded to the charge pump 13. The charge pump 13 outputs a charge current that charges or discharges the capacitor C1 of the loop filter 15 to a voltage level $V_{lpf}$. The charge pump 13 receives the error signals U, D, a bias voltage input $V_{bp}$ from the common bias generator 16, and the logic signals S1, S2, S3 from the charge pump control circuit 14, as will be described in greater detail hereinafter. $V_{bp}$ is a reference bias voltage which controls the charge pump 13 output current. It is well known to those skilled in the art that the charging and discharging of the loop filter 15 capacitor C1 creates a voltage change $V_{lpf}$ across the loop filter 15. As the voltage $V_{lpf}$ increases, the charge pump 13 output current decreases. This voltage change $V_{lpf}$ is a reference for the common bias generator 16 and the current range control circuit 17 to generate the reference signals which control the amount of delay generated by each delay element $20_a \ldots 20_n$.

The logic signals S1, S2, S3 received by the charge pump 13 from the charge pump control circuit 14 are equivalent to 1, 1, 1, respectively. This output allows the charge pump 13 to output a maximum charge current, causing the DLL 10 to have a high frequency response to the error signals U, D. However, when the DLL circuit 10 receives a high frequency reference signal, such as greater than 300 MHz, the charge pump control circuit 14 receives a logic one (1) signal from H-$F_{ref}$, which detects the existence of this high frequency reference signal. The charge pump control circuit 14 converts a charge control signal $CC_{signal}$ and adjusts the outputs of the three logic signals S1, S2, S3, which in turn adjusts the amount of charge current output by the charge pump 13. When H-$F_{ref}$ equals logic one (1), the signals S1, S2, S3 output from the charge pump control circuit 14 may be equivalent to 1, 1, 0 or 1, 0, 1, respectively, for example. The charge control signal $CC_{signal}$ is an outside input signal whose value depends on the device or process for which the DLL 10 output $F_o$ is to be used. The charge pump control circuit 14 converts the charge control signal $CC_{signal}$ to the logic signals S1, S2, S3. This instructs the charge pump 13 to switch out an internal current source (not shown) when the logic signal S1, S2, or S3 associated with the current source is zero (0), thereby dividing the current of the charge pump 13 by a number m (e.g., 3, 6, or 9). The use of the charge pump control circuit 14 when a high frequency input signal is detected provides a reduced frequency response to the error signals U, D as the phase of the output signal $F_o$ is adjusted to match the phase of the input signal $F_{ref}$, providing better jitter performance.

The loop filter 15, which comprises a capacitor C1, is coupled to the current range control circuit 17, the common bias generator 16, and the charge pump 13. This loop filter 15 receives a charge current generated by the charge pump 13 and an outside input voltage $V_{dd}$. As a result of the charging or discharging of the capacitor C1, a voltage $V_{lpf}$ is created and output to the current range control circuit 17 and the common bias generator 16.

Figure 5:
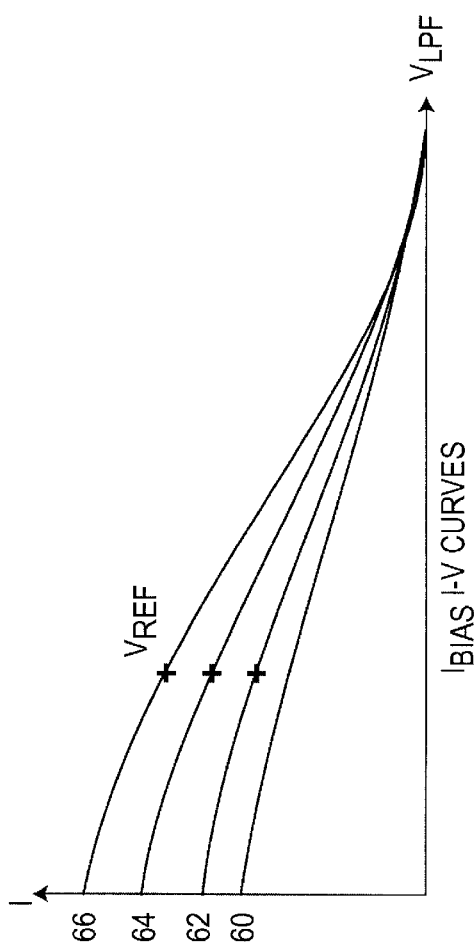
FIG. 5 is an example of a graph of four I-V curves in accordance with the preferred embodiment of the present invention.

The current range control circuit 17, coupled to the output of the loop filter 15 and the lock circuit 12, the delay cell switching circuit 21 and the common bias generator 16, comprises two voltage comparators (not shown) and two (2) single bit outputs R0, R1. The current range control circuit 17, receives the loop filter 15 output voltage $V_{lpf}$ and adjusts the level of the bias current $I_{bias}$ generated in the common bias generator 16, through the output leads R0, R1. The voltage comparators in the current-range control circuit 17 monitor the voltage $V_{lpf}$ against an internal reference voltage $V_{ref}$, which is indicative of the point where a small change in the voltage $V_{lpf}$ causes a large change in the bias current $I_{bias}$. The reference voltage $V_{ref}$, which can be fixed or variable, is illustrated in the $I_{bias}$ I-V curves 60–66 of FIG. 5. As those skilled in the art should know, each of these curves 60–66 include a nonlinear region where a small increase in the voltage creates a large decrease in the current. This nonlinear region creates a large change in the delay elements $20_a \ldots 20_n$, causing increased jitter within the DLL circuit 10. If the DLL circuit 10 is operated past a certain voltage point $V_{ref}$ on the curves and into the nonlinear region, the amount of jitter will increase and the overall performance of the DLL circuit 10 will decrease. Therefore, when the voltage $V_{lpf}$ is greater than the reference voltage $V_{ref}$, the PFD 11, bias generator 16 and lock circuit 12 receive a local reset signal Cal_reset from the current range control circuit 17 which resets the voltage $V_{lpf}$ to zero (0). The current range control circuit 17 outputs R0, R1 switch states, adjusting the bias current $I_{bias}$ to a lower level.

Initially, when the DLL circuit 10 is reset, the current range control circuit 17 receives a logic zero (0) signal from the lock circuit 12 and signals the bias generator 16 to switch on all four current sources $I_1$, $I_2$, $I_3$, $I_4$, which is indicated by the output 0, 0 for the two output leads R0, R1, respectively. The current range control circuit 17 also resets a delay cell signal DC at the input of a delay cell switching circuit 21, which sets the number of delay cells to the lowest delay level. When the lock circuit 12 detects the crossing of the phase of the reference and output signals $F_{ref}$, $F_o$, the current control circuit 17 is signaled to lock the common bias generator 16 at the present bias current level, which is the optimal bias current curve for the DLL circuit 10 performance. As disclosed above, when the voltage comparators in the current range control circuit 17 detect that the $V_{lpf}$ is too high, the current range control circuit 17 output leads R0, R1 switch by one (1). For example, after the resetting of the DLL circuit 10, the output leads R0, R1 are equivalent to 0, 0. When the comparator detects the high voltage $V_{lpf}$, the output leads R0, R1 switch to 0, 1, respectively, which indicates that the common bias generator 16 should switch off current source $I_4$. The current range control circuit 17 also outputs an internal reset signal Cal_reset to the PFD 11, the lock circuit 12, and the bias generator 16 which resets the voltage $V_{lpf}$ to zero (0). Each time the voltage comparators of the current range control circuit 17 detect this condition, the output leads R0, R1 increase by one (1) and another current source (for example $I_3$) is switched off. This process continues until the output leads R0, R1 are equivalent to 1, 1, where the only remaining current source is $I_1$. At this point, the current range control circuit 17 outputs a logic one (1) delay cell signal DC to the delay cell switching circuit 21, indicating that the maximum number of delay cells $20_a \ldots 20_n$ should be used. The reset signal Cal_reset is also output, thereby resetting the aforementioned components and the output leads $R_0$, $R_1$. The current range control circuit 17 again steps through the process described above. Once the current range control circuit 17 reaches the lowest bias current level for the second time, the common bias generator 16 is signaled to lock at the lowest bias current level $I_1$.

If the reference voltage $V_{ref}$ is greater than the loop filter 15 voltage $V_{lpf}$ and the lock circuit output is a logic one (1), the current range control circuit 17 remains at the present bias current level, which is considered the optimal operating point for the process utilizing the DLL 10 output signal $F_o$. As those skilled in the art should know, even though the current range control circuit 17 is illustrated utilizing two (2) single bit outputs R0, R1, a single two bit output may also be utilized. It should also be obvious to those skilled in the art that even though the current invention only utilizes four (4) bias current levels, the current range control circuit 17 can be designed to provide for more or less levels of current control.

Figure 4A:
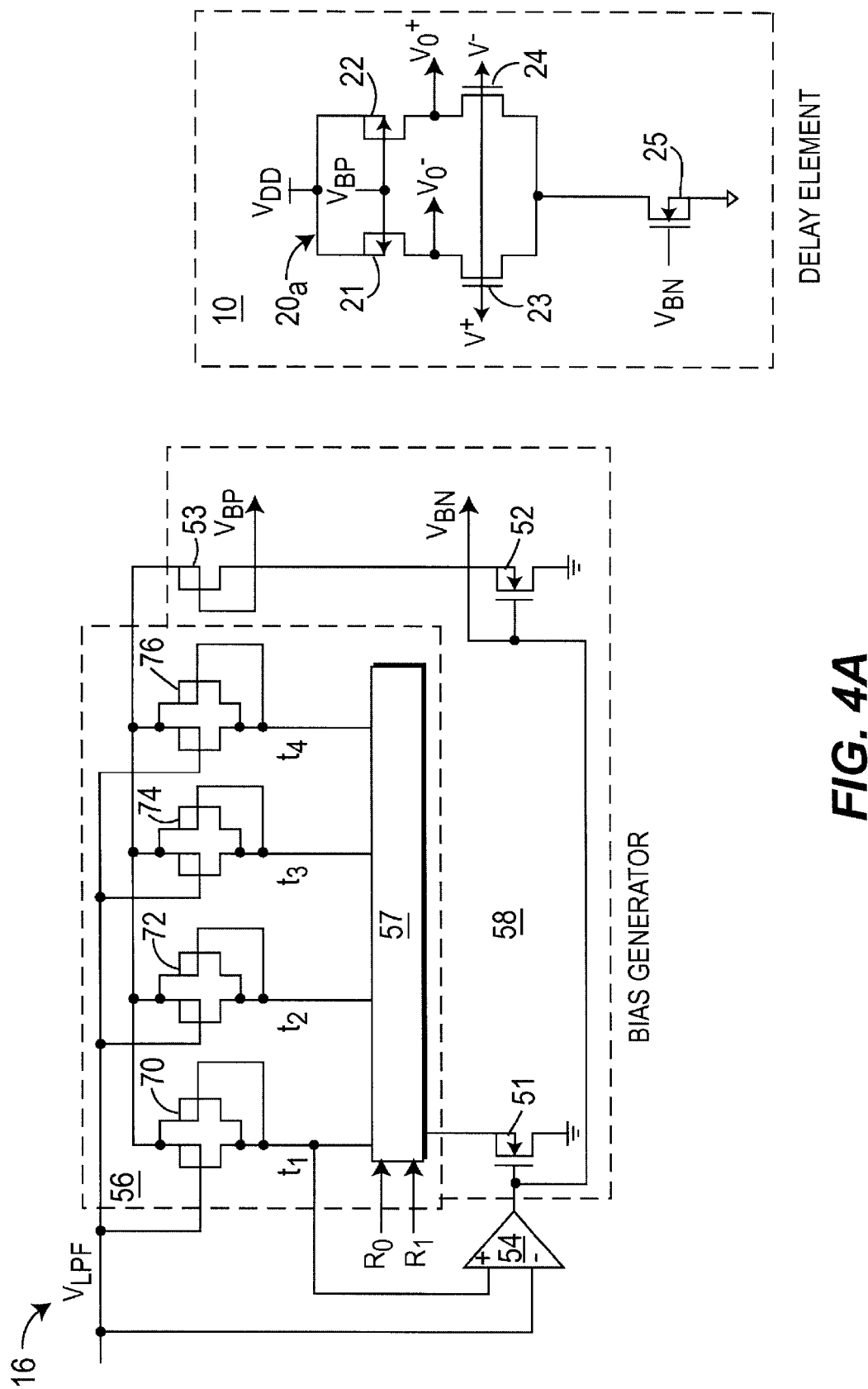
FIG. 4A is s diagram of the bias generator and a delay element in accordance with the preferred embodiment of the present invention.
Figure 4B:
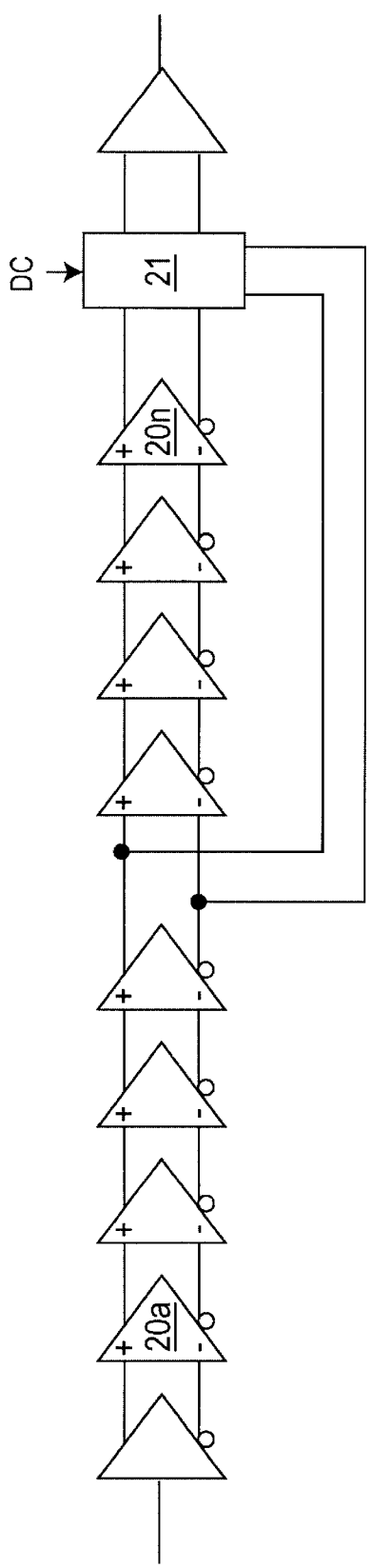
FIG. 4B is a diagram of a representation of the configuration of the delay elements with the switching circuit.

Referring to FIG. 4B, the delay cell $20_a \ldots 20_n$, with a single differential amplifier representing a single differential delay element is shown. The number of delay cells $20_a \ldots 20_n$ utilized by the DLL 10 is determined by the delay cell switching circuit 21. When the DLL 10 is reset, the current range control circuit 17 sends a logic zero (0) delay cell signal DC to the delay cell switching circuit 21, resetting it to the lowest delay cell count. For purposes of the preferred embodiment of the present invention, the lowest delay cell count is six (6). When the control circuit 17 sends a logic one (1) delay cell signal DC, the delay cell switching circuit 21 increases the number of delay cells used by the DLL 10 to its maximum count; which for purposes of the present invention is twenty 20 delay cells. The minimum and maximum delay cell counts may be changed depending on the device and process. Additionally, even though the present invention has only two levels of delay cell counts, minimum and maximum, the switching circuit 21 may provide for more levels.

Since each of the delay elements $20_a \ldots 20_n$ draw transient power, the reduced delay cell count allows the DLL 10 to consume less power because fewer delay cells are used. The delay cell switching circuit 21 coupled to the current range control circuit 17 provides the DLL circuit 10 with more flexibility and faster locking times.

Referring to FIG. 4A, the present invention utilizes a single common bias generator 16, comprising a bias current generator 56, a bias voltage generator 58 and a differential amplifier 54. The differential amplifier 54 reduces the noise from the power supply. The differential amplifier provides improved power supply rejection ratio performance. The bias current generator 56 includes four symmetric loads 70, 72, 74, 76 and a switching circuit 57. Each of the symmetric loads 70, 72, 74, 76, which may or may not have the same device width, has as its voltage source $V_{dd}$ and the low pass filter output signal $V_{lpf}$ as its control voltage. The four symmetric loads 70, 72, 74, 76 act as current sources $I_1$, $I_2$, $I_3$, $I_4$. These current sources $I_1$, $I_2$, $I_3$, $I_4$ are switched on and off by the switching circuit 57. The outputs R0, R1 from the current range control circuit 17 dictate to the switching circuit 57 which of the current sources should be on and which should be off. As should be known to those skilled in the art, there are numerous switching circuits which are responsive to a digital input and can be used as described herein. In this manner, the current range control circuit 17 provides four discrete levels of bias current $I_{bias}$. This allows for better control of the DLL circuit 10 by providing the flexibility of varying the current slope without having to vary the delay cell itself. The bias current $I_{bias}$ is output from the bias current generator 56 to the bias voltage generator 58.

The bias voltage generator 58 comprises two n channel transistors 51, 52 and one p channel transistor 53. The gate voltage of the n channel transistors 51, 52 is connected to the output of the differential amplifier 54. This differential amplifier 54 works to eliminate the noise generated by power supply voltage $V_{dd}$. The n channel transistors 51, 52 are configured such that the bias current $I_{bias}$ through transistor 51 is mirrored onto transistor 52 and reflected up to transistor 53. When the bias current $I_{bias}$ is mirrored in this way, two reference voltages are created. The two reference voltages are the bias voltages $V_{bn}$ and $V_{bp}$, which determine the amount of delay for each delay element $20_a \ldots 20_n$. This configuration also provides the bias current $I_{bias}$ from the common bias generator 16 to each delay element $20_a \ldots 20_n$. Using this common bias generator 16 and a selectable number of delay cells $20_a \ldots 20_n$ will provide better linearity in the overall delay of the DLL circuit 10.

Referring still to FIG. 4A, each delay cell $20_a \ldots 20_n$ contains two p channel transistors 21 and 22 and three n channel transistors 23, 24, 25. Transistors 23, 24 act as switches in the delay cell $20_a$ and determine the actual delay for each element based on the bias current $I_{bias}$ via the voltages $V_{bn}$ and $V_{bp}$. The p channel transistors 21, 22 act as current sources for the transistors 23, 24. Transistor 25 acts as a current source as well. The p channel transistors 21, 22 are biased by the voltage $V_{bp}$. Since the amount of bias current $I_{bias}$ determines the voltage $V_{bp}$, the delay time changes with $V_{bp}$. Transistors 23 and 24 receive a voltage input $V^+$, and $V^-$. The delay elements $20_a \ldots 20_n$ are configured in such a way that the voltage inputs $V^+$, $V^-$ of the delay elements come from the voltage outputs $V_o^+$, $V_o^-$ of the preceding delay elements. The voltage outputs $V_o^+$, $V_o^-$ from the last delay element $20_n$ are coupled to a differential amplifier 22.

The current supplied by transistor 22 does not pass through transistor 24 when transistor 24 is "off" (or not conducting). Likewise, when transistor 23 is not conducting, the current provided by transistor 21 does not pass through transistor 23. There are parasitic capacitances at the inputs of transistors 23 and 24 that charge and discharge to affect the voltages $V^+$ and $V^-$, which rise and fall. When transistors 23 and 24 are on and off, respectively, the charge on the parasitic capacitors at the input of transistors 23 and 24 on the subsequent delay cell will be affected. When transistor 23 is turned on, it discharges the parasitic capacitances of the next delay cell and $V_o^-$ changes from $(V_{dd}-V_{ds}21)$ to $(0V+V_{ds}23+V_{ds}25)$. Likewise, when transistor 24 is off, transistor 22 charges the capacitance of the following delay cell and $V_o^+$ changes from $(0V+V_{ds}24+V_{ds}25)$ to $(V_{dd}-$ $V_{ds}22$), the drain to source voltage of transistor 22 at saturation. As is well known to those skilled in the art, the delay provided by the delay cell is equivalent to the duration between turning on transistor 23 and turning off transistor 24, and when the voltages $V^+$ and $V^-$ are equal. When this point is reached, the transistors in the next delay cell are activated. $V_o^+$ and $V_o^-$ are the output voltages of each delay cell that provide the input voltages $V^+$, $V^-$ to the next delay cell.

Figure 6:
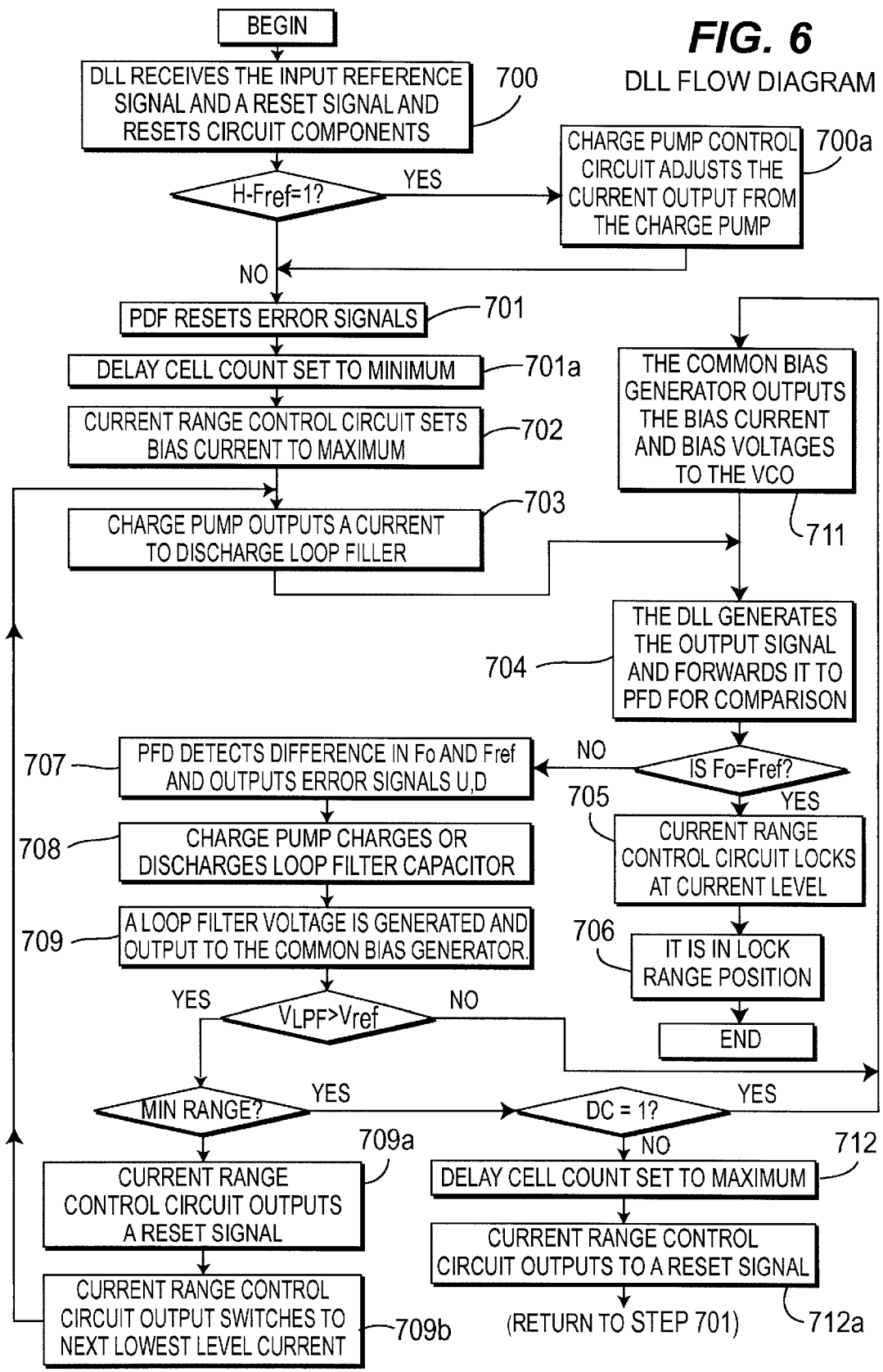
FIG. 6 is a flow diagram in accordance with the preferred embodiment of the present invention.

The flow diagram in accordance with present invention is illustrated in FIG. 6. The DLL circuit 10 receives a reset signal $DLL_{reset}$ from an external source and resets all DLL 10 circuit components (step 700). If the reference signal is a high frequency reference signal, the $H\text{-}F_{ref}$ signal goes high, activating the charge pump control circuit 14. The charge pump control circuit 14 then outputs logic signals S1, S2, S3 to the charge pump 13 to adjust the current in the charge pump 13, in accordance with the charge control signal $CC_{signal}$ (step 700a). The PFD 11 resets the error signals U, D (step 701). The current range control circuit 17 receives the reset signal $DLL_{reset}$ from the outside source and sets the bias current level of the common bias generator 16 to the maximum ($I_1+I_2+I_3+I_4$) and sets the delay cell count to its minimum (step 701a). The charge pump 13 outputs the appropriate charge current (step 703), generating a DLL circuit 10 delayed output signal $F_o$. The delayed output signal $F_o$ is then output to the PFD 11 to be compared to the reference signal $F_{ref}$ (step 704). If $F_o$ is in phase with $F_{ref}$, the lock circuit 12 signals the current range control circuit 17 to lock at the present current level (step 705). Once the bias current level $I_{bias}$ is locked, the DLL circuit 10 is in lock range position (step 706) and the procedure terminates.

If the two signals $F_{ref}$, $F_o$ are out of phase, the PFD II outputs the error signals U, D, whose duration depend on the amount of phase error that is detected between the two signals $F_{ref}$, $F_o$ (step 707). The charge pump 13 receives the error signals U, D from the PFD 11 and the logic signals S1, S2, S3 from the charge pump control circuit 14 and outputs a current, commensurate with those signals, which sources or sinks the loop filter 15 capacitor C1 (step 708). As a result of the charging or discharging of the loop filter 15 capacitor C1, the control voltage $V_{lpf}$ is generated (step 709). If the loop filter 15 voltage $V_{lpf}$ is greater than $V_{ref}$ and the current range control circuit 17 is not in the minimum range with the delay cell signal DC equal to one (1), the current range control circuit 17 outputs a local reset signal Cal_reset, which resets the voltage $V_{lpf}$ to zero (0) (step 709a). The current range control circuit 17 outputs R0, R1 then switch to the next lowest level (step 709b).

If the current range control circuit 17 is at the minimum current level (i.e., R0, R1 is equal to 1,1) and the delay cell signal DC is equal to one (1), the common bias generator 16 outputs the bias current $I_{bias}$ and bias voltages $V_{bp}$, $V_{bn}$ to the plurality of delay cells $20_a \ldots 20_n$ (step 711), which generates the DLL circuit 10 output signal $F_o$ (step 704).

If the delay cell signal is equal to zero (0) when the current range control circuit 17 is at the minimum current level (i.e., R0, R1 is equal to 1,1), the current range control circuit 17 signals the switching circuit 21 to use the maximum number of delay cells (step 712) (DC=1) and outputs the internal reset signal Cal_reset (712a). When the delay cell signal DC switches from zero (0) to one (1), the process is started again (step 701).

This design of the DLL circuit 10, in accordance with the preferred embodiment, will achieve a wide operating frequency range with a short lock in time and good jitter performance over a wide power supply voltage range. The differential DLL, operating in the biasing current mode, provides a much wider operating frequency range with high common-mode noise immunity. The common biasing technique provides the necessary bias with less sensitivity to temperature and process variations. It also provides better power supply rejection ratio and current range calibration regulation when the power supply droops or when process variations change.

While a specific embodiment of the present invention has been shown and described, many modifications and variations can be made by one skilled in the art without departing from the spirit and scope of the invention. The above description serves to illustrate and not limit the particular form in any way.

What is claimed is:

1. A delay locked loop (DLL) circuit having a plurality of differential delay elements which generate a precisely delayed output signal relative to an input reference signal; said DLL comprising:

a phase detector for detecting the phase difference between said reference signal and said output signal and producing an error signal;

a lock circuit, responsive to said error signal, for detecting when said error signal is zero; and a delay element control circuit, responsive to said phase detector and said lock circuit, for increasing and decreasing the phase of said output signal; whereby said delay element control circuit maintains the phase of said output signal when said error signal is zero.

2. The DLL circuit of claim 1 wherein said delay element control circuit comprises:

a charge pump, for receiving said error signal and outputting a charge current based upon said error signal;

a loop filter which receives said charge current and outputs a control voltage; and a bias generator, responsive to said loop filter, for generating first and second bias voltages to control said delay elements.

3. The DLL circuit of claim 2 wherein said delay element control circuit further comprises a current range control circuit, responsive to said lock circuit and said loop filter, for adjusting said bias generator.

4. The DLL circuit of claim 3 wherein said current range control circuit receives said control voltage and outputs a current control signal and a delay control signal; whereby said current control signal is generated from comparing said control voltage to a reference voltage.

5. The DLL circuit of claim 4 wherein said bias generator comprises:

a bias current generator having a plurality of current sources to generate a bias current based upon said control voltage and said current control signal; and a bias voltage generator for receiving said bias current from said bias current generator and generating said first and second bias voltages.

6. The DLL circuit of claim 5 wherein said bias generator further comprises a current source switching circuit for controlling said bias current generator by selectively activating said current sources in response to said current control signal.

7. The DLL circuit of claim 3 wherein said plurality of differential delay elements are selectively controlled, each of said delay elements including;

a first input associated with a negative output;

a second input associated with a positive output;

said positive and negative outputs selectively coupled to a constant voltage source responsive to said first bias voltage;

said positive and negative outputs also selectively coupled to a ground and being responsive to said second bias voltage and said first and second inputs;

said selective coupling of said constant voltage source and said positive output being a first single transistor; and said selective coupling of said constant voltage source and said negative output being a second single transistor.

8. The DLL circuit of claim 2 further comprising a differential delay element switching circuit, whereby a delay element count is adjusted in response to said delay control signal; said delay element count being equal to the number of differential delay elements used to generate said precisely delayed output signal.

9. The DLL circuit of claim 2, wherein said delay element control circuit further comprises a charge pump control circuit for dividing said charge current.

10. The DLL circuit of claim 9 wherein said charge pump control circuit receives said input reference signal and a charge control signal and outputs a charge pump control signal when said input reference signal is greater than a threshold frequency.

11. The DLL of claim 7 whereby said threshold frequency is 300 MHz.

12. A method for controlling a plurality of differential delay elements using a delay locked loop (DLL) circuit to generate a precisely delayed output signal relative to an input reference signal; the method comprising the steps of:

detecting the phase difference between said reference signal and said output signal and producing an error signal;

detecting when said error signal approaches zero;

adjusting the phase of said output signal toward said precisely delayed signal; and maintaining said phase of said output signal when said error signal is zero.

13. The method of claim 12 further comprising the steps of:

receiving said error signal and outputting a charge current;

receiving said charge current and outputting a control voltage;

generating first and second bias voltages to control said delay elements;

comparing said control voltage to a reference voltage; and adjusting said first and second bias voltages in response to said comparison.

* * * * *

UNITED STATES PATENT AND TRADEMARK OFFICE
CERTIFICATE OF CORRECTION

PATENT NO.    : 6,411,142 B1
DATED         : June 25, 2002
INVENTOR(S)   : Saeed Abbasi et al.

It is certified that error appears in the above-identified patent and that said Letters Patent is hereby corrected as shown below:

The sheet of drawing consisting of figures 3A, 3B and 3C should be deleted to appear as per attached figures.

Signed and Sealed this

Nineteenth Day of August, 2003

JAMES E. ROGAN
*Director of the United States Patent and Trademark Office*

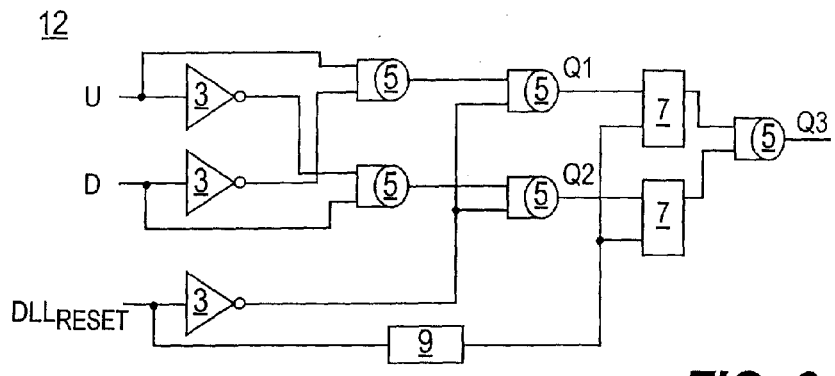
FIG. 3A
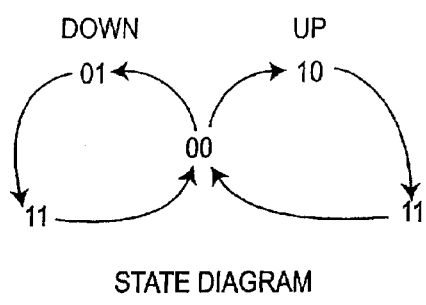
FIG. 3B
| UP | DOWN | Q1 | Q2 | Q3 |
|----|------|----|----|----|
| 0 | 0 | 0 | 0 | 0 |
| 0 | 1 | 0 | 1 | 0 |
| 1 | 1 | 0 | 1 | 0 |
| 0 | 0 | 0 | 1 | 0 |
| 0 | 1 | 0 | 1 | 0 |
| 1 | 1 | 0 | 1 | 0 |
| - | - | - | - | 0 |
| 0 | 0 | 0 | 1 | 0 |
| 1 | 0 | 1 | 1 | 1 |
| 1 | 1 | 1 | 1 | 1 |
| 1 | 1 | 1 | 1 | 1 |
| - | - | - | - | 1 |
| 0 | 0 | 1 | 1 | 1 |
| 0 | 1 | 1 | 1 | 1 |
| 1 | 1 | 1 | 1 | 1 |
| - | - | - | - | 1 |
| 0 | 0 | 1 | 1 | 1 |
| 1 | 0 | 1 | 1 | 1 |
| 1 | 1 | 1 | 1 | 1 |
EXAMPLE OF LOCK PROC
FIG. 3C